(12) United States Patent
Lanzerotti et al.

(10) Patent No.: US 7,485,965 B2
(45) Date of Patent: Feb. 3, 2009

(54) THROUGH VIA IN ULTRA HIGH RESISTIVITY WAFER AND RELATED METHODS

(75) Inventors: Louis D. Lanzerotti, Burlington, VT (US); Max G. Levy, Essex Junction, VT (US); Yun Shi, South Burlington, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/753,617

(22) Filed: May 25, 2007

(65) Prior Publication Data

US 2008/0290524 A1 Nov. 27, 2008

(51) Int. Cl.
*H01L 27/01* (2006.01)

(52) U.S. Cl. ........................ 257/770; 438/405

(58) Field of Classification Search ............... 257/506, 257/770; 438/405
See application file for complete search history.

(56) References Cited

U.S. PATENT DOCUMENTS 6,835,981 B2 * 12/2004 Yamada et al. ............. 257/347

* cited by examiner

*Primary Examiner*—Roy K Potter
(74) *Attorney, Agent, or Firm*—William D. Sabo; Hoffman Warnick LLC

(57) ABSTRACT

A through via in an ultra high resistivity wafer and related methods are disclosed. A method for forming a through via comprises: providing a semiconductor wafer including a first silicon layer, a buried dielectric layer, and a substrate; forming a device on the first silicon; and forming a via from a side of the substrate opposite to the buried dielectric layer and through the substrate. Also disclosed is a method for providing a wafer varied resistivity using the through vias and buried dielectric.

9 Claims, 3 Drawing Sheets

THROUGH VIA IN ULTRA HIGH RESISTIVITY WAFER AND RELATED METHODS

BACKGROUND

1. Technical Field

The disclosure relates generally to integrated circuit (IC) chip fabrication, and more particularly, to a through via in an ultra high resistivity wafer and related methods.

2. Background Art

A vertical stacking method to integrate multiple chips on a two-dimensional (2-D) or three-dimensional (3-D) package may need the use of through vias to reduce the interconnect delay and maximize circuit performance. In conventional approaches, a through via is formed through a whole wafer of a chip, and thus can only be positioned by the sides of devices on the wafer. As a consequence, the issue of alignment hampers via formation and chip stacking processes.

Radio frequency (RF) SOI technology requires ultra high resistivity wafers to deal with insertion loss. In many situations, it is preferable that a chip maintains the ultra high resistivity on the top surface while having lowered resisitivity on the bottom surface. There is no satisfactory solution for this in the conventional technologies.

SUMMARY

A first aspect of the disclosure provides a method comprising: providing a semiconductor wafer including a first silicon layer, a buried dielectric layer, and a substrate; forming a device on the first silicon; and forming a via from a side of the substrate opposite to the buried dielectric layer and through the substrate.

A second aspect of the disclosure provides a structure comprising: a first silicon layer including a device thereon; a buried dielectric layer; a substrate; and a via formed from a side of the substrate opposite from the buried dielectric layer and through the substrate.

A third aspect of the disclosure provides a method for producing a wafer with a varied resistivity, the method comprising: providing a wafer with a first resistivity, the wafer including a first silicon layer, a buried dielectric layer, and a substrate; and forming a via from a side of the substrate opposite to the buried dielectric layer and through the substrate to obtain a second resistivity in a substrate side portion of the wafer; wherein the second resistivity is lower than the first resistivity.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
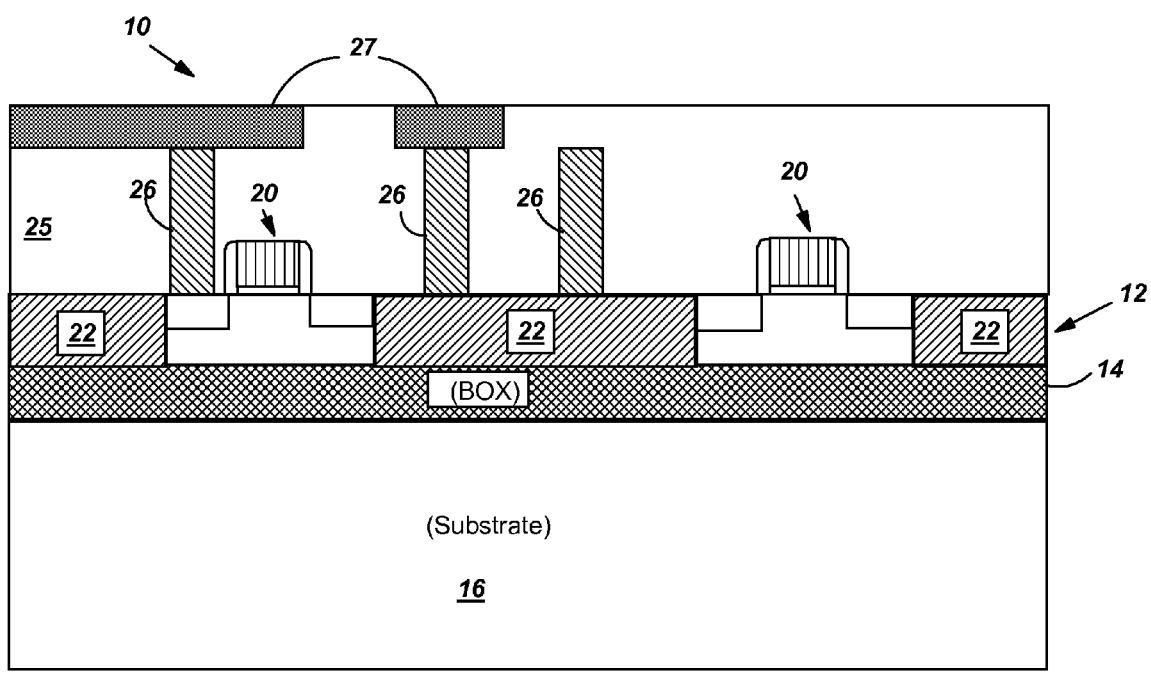
FIGS. 1-3 show embodiments of a method of forming a through via, with FIG. 3 showing embodiments of through vias.
Figure 2:
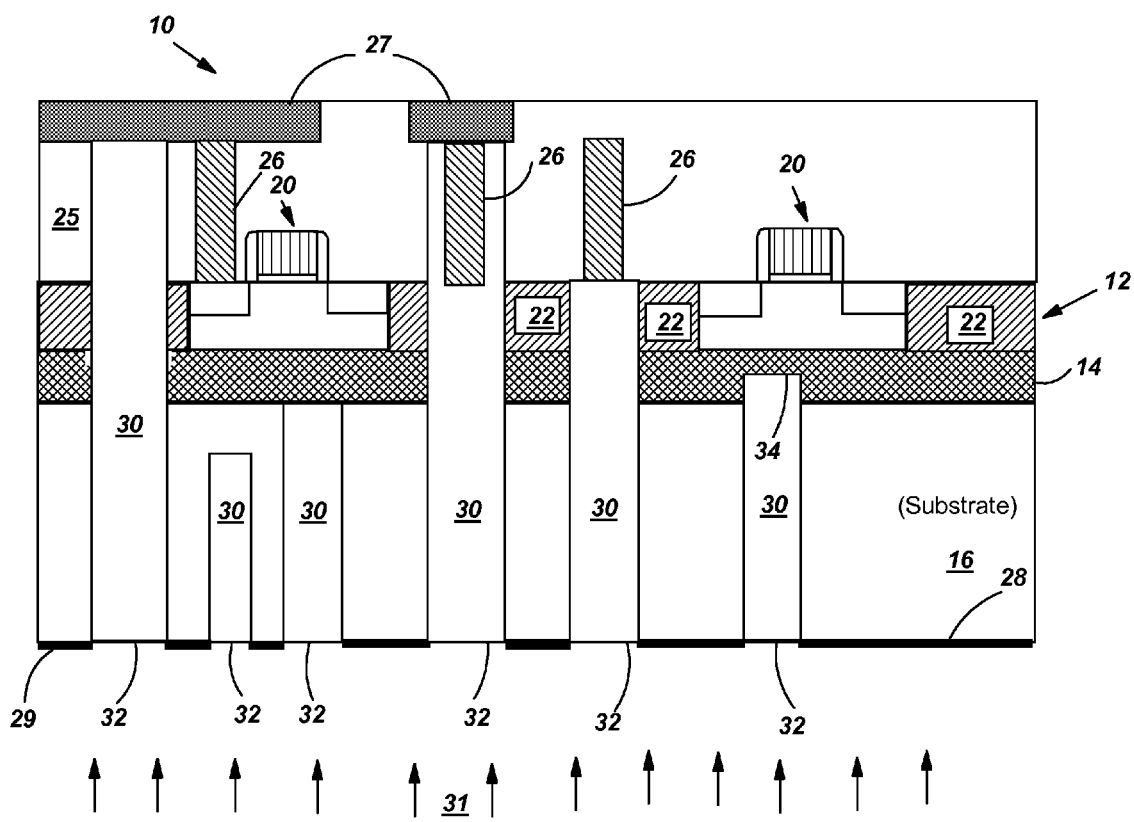
Figure 3:
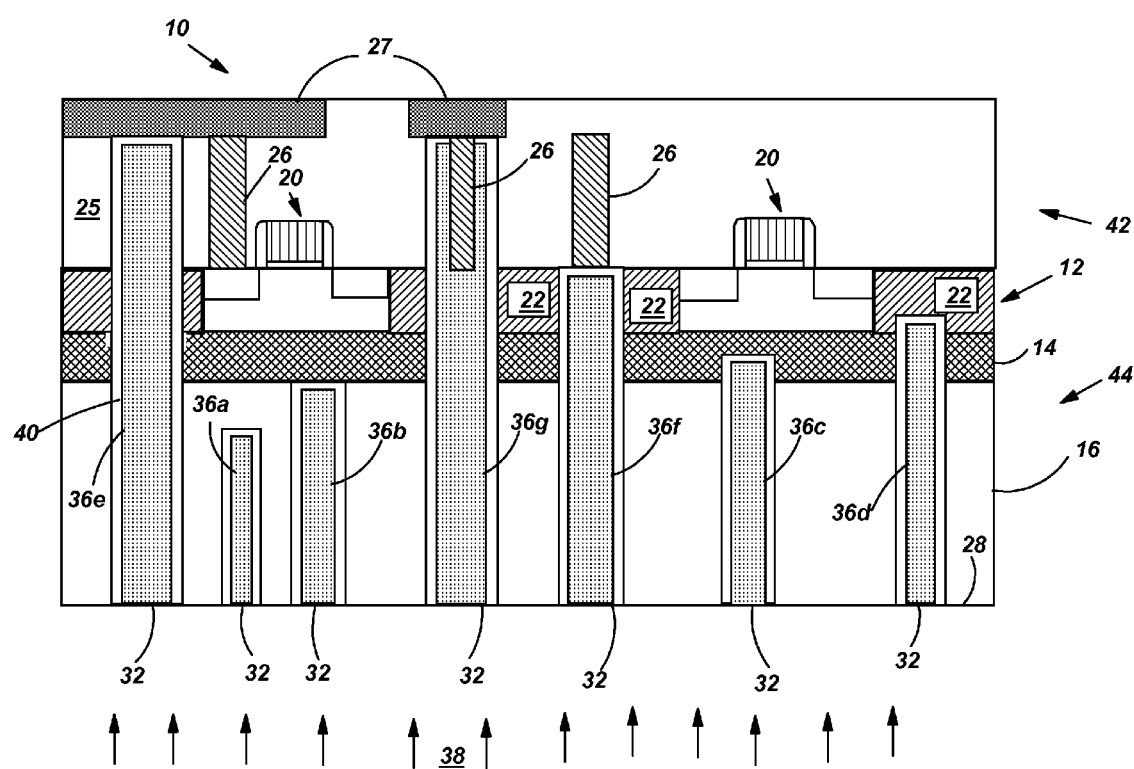

Referring to the drawings, FIGS. 1-3 show embodiments of a method of forming a through via 36, with FIG. 3 showing embodiments of through vias 36.

Referring to FIG. 1, a silicon-on-insulator (SOI) wafer 10 is formed/provided. SOI wafer 10 includes a first silicon layer 12 (usually referred to as front side silicon layer), a buried dielectric (e.g., oxide) layer (BOX) 14 below first silicon layer 12, and a substrate 16 (e.g., second silicon layer) below BOX layer 14. A device(s) (e.g., a PNP) 20 may be formed on first silicon layer 12. As is appreciated, devices 20 may be separated by shallow trench insulation (STI) regions 22. Further, insulation layer (e.g., interlayer dielectric layer) 25 is formed above first silicon layer 12. Tungsten studs 26 may be formed in insulation layer(s) 25 and a metal layer 27 (interconnect) may be formed following tungsten studs 26 on the surface of insulation layer 25. Any now known or later developed method may be used to form wafer 10 and all are included. In addition, any parameters of the components of wafer 10 are included. For example, BOX layer 14 may include a thickness of approximately 5 micrometers or less.

According to an embodiment, wafer 10 may be of ultra high resistance, e.g., approximately 1000-10000Ω. The resistance refers to both thermal resistance and electrical resistance.

It should be appreciated that although an SOI wafer is used for illustration herein, other semiconductor wafers may also be used.

Referring to FIG. 2, side 28 (which is opposite to BOX layer 14) of substrate 16 is planarized. Any method may be used in the planarizing, and all are included. For example, a chemical mechanical polishing (CMP) may be used to planarize side 28.

In addition, troughs 30 is formed from side 28. Any now known or later developed techniques may be used in forming troughs 30, and all are included. While only one example of the techniques is described herein, other processes, however, will be readily understood by those with ordinary skill in the art. In one example, hard mask 29 such as silicon dioxide ($SiO_2$) or silicon nitride ($Si_3N_4$) can be vapor-deposited over side 28. The thickness of the hard mask is typically approximately 50 nm to approximately 200 nm. Photoresist (not shown) may be spin-applied over hard mask 29 to a thickness of approximately 100 nm to approximately 300 nm, and lithographically patterned with the desired opening for trough 30 opening 32. The resist pattern is etched into hard mask 29 (for example, using reactive ion etch (RIE) conditions: trifluoromethane-oxygen-argon ($CHF_3/O_2/Ar$) gases, 20-150 mtorr pressure and 500-1500 watts), and the photoresist may then be removed. Another RIE 31 may then be performed to form trough 30 through opening 32 from side 28. Size of opening 32 may be selected based on the desired depth of trough 30. As is appreciated, the width of opening 32 may influence a depth of the etched troughs 30. The depth of trough 30 refers to a distance between opening 32 to a bottom 34 of trough 30. Specifically, other conditions being the same, a trough 30 with a wider opening 32 will be deeper than a trough 30 with a narrower opening 32. As such, RIE 31 can be controlled to achieve trough 30 of different depths, or different combinations of troughs 30 with different depths as will be described herein, with a proper end-point detection method. Such end-point detection methods are known in the art.

Referring to FIG. 3, through vias 36 are formed through substrate 16 by filling troughs 30 with metal or other conductive fillings 38. A sidewall dielectric coating 40 may also be formed before fillings 38.

FIG. 3 also shows embodiments of through vias 36. In all embodiments shown, vias 36 are formed from side 28 of wafer 10 through substrate 16 as described above. As shown, via 36a is located totally within substrate 16; via 36b abuts BOX layer 14; and via 36c penetrates and ends within BOX layer 14. In the above three embodiments, it can be achieved that a via 36 (36a, 36b, and 36c) is positioned directly below a device 20, which eliminates the potential alignment issues in processing. In addition, via 36 may also extend beyond BOX layer 14 by the sides of devices 20. For example, via 36d penetrates STI portion 22 and ends within STI portion 22; via 36e abuts and intersects metal layer 27; via 36f abuts and intersects tungsten stud 26; and via 36g intersects both metal layer 27 and tungsten stud 26. It should be appreciated that the above described embodiments do not limit the scope of the disclosure. Other embodiments of via 36 may also be possible.

As vias 36 are formed from side 28 through substrate 16, the resistance in a second (the substrate side) portion 44 of wafer 10 is lowered compared to the resistance in a first (the device side) portion 42 of wafer 10. As such, the functional characteristics of a high resistivity wafer and the thermal characteristics of a low resistivity wafer can be achieved simultaneously by wafer 10. In addition, the depth of via 36 contributes to the different combination/balance between first portion 42 high thermal resistance and second portion 44 low resistance. For example, via 36a is located totally within substrate 16, which lowers second portion 44 resistance, but keeps the low resistivity portion away from BOX layer 14. Via 36b abuts BOX layer 14, which achieves the lowest possible second portion 44 resistance without affecting BOX layer 14, and BOX layer 14 can function as a stop point between high resistivity first portion 42 and low resistivity second portion 44. Via 36c penetrates and ends within BOX layer 14, which lowers the resistance of BOX layer 14 and substrate 16, in series.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
providing a semiconductor wafer including:
a first silicon layer,
a buried dielectric layer located on a first side of the first silicon layer, and
a substrate located on one side of the buried dielectric layer opposite to the first silicon layer;
forming a device on the first silicon layer; and
forming a via from below the device from a side of the substrate opposite to the buried dielectric layer and through the substrate.

2. The method of claim 1, wherein the via forming includes forming a trough from the side and through the substrate, and filling the trough with a conductive material.

3. The method of claim 2, in the case of forming multiple vias, further comprising controlling a relative depth of each via by controlling a relative size of a trough opening in the side of the substrate for each via.

4. A structure comprising:
a first silicon layer including a device thereon;
a buried dielectric layer located on a first side of the first silicon layer;
a substrate located on one side of the buried dielectric layer opposite to the first silicon layer; and
a via formed from below the device from a side of the substrate opposite from the buried dielectric layer and through the substrate.

5. The structure of claim 4, wherein the via extends the side of the substrate to an extent that the via one of:
ends within the substrate;
abuts a buried dielectric layer between the substrate and the first silicon layer; or
penetrates and ends within the buried dielectric layer.

6. The structure of claim 5, wherein the via is positioned directly below the device.

7. The structure of claim 4, wherein the via extends from the side of the substrate and by a side of the device.

8. The structure of claim 7, wherein the via one of:
penetrates and ends within a shallow trench isolation portion adjacent to the device;
abuts and intersects a metal layer positioned above the device;
abuts and intersects a Tungsten stud above the device; or
intersects a metal layer and a Tungsten stud above the device, the metal layer and the tungsten stud intersecting one another.

9. A method for producing a wafer with a varied resistivity, the method comprising:
providing a wafer with a first resistivity, the wafer including
a first silicon layer,
a buried dielectric layer located on a first side of the first silicon layer, and
a substrate located on one side of the buried dielectric layer opposite the first silicon layer; and
forming a via from below the device from a side of the substrate opposite to the buried dielectric layer and through the substrate to obtain a second resistivity in a substrate side portion of the wafer;
wherein the second resistivity is lower than the first resistivity.

* * * * *